(12) United States Patent
Shen

(10) Patent No.: US 6,262,483 B1
(45) Date of Patent: Jul. 17, 2001

(54) SEMICONDUCTOR CHIP MODULE AND METHOD FOR MANUFACTURING THE SAME

(76) Inventor: Ming-Tung Shen, 4F, No. 52, Sec. 2, Chung-Shan N. Rd., Taipei (TW)

( * ) Notice: Subject to any disclaimer, the term of this patent is extended or adjusted under 35 U.S.C. 154(b) by 0 days.

(21) Appl. No.: 09/329,598

(22) Filed: Jun. 10, 1999

(30) Foreign Application Priority Data

Apr. 16, 1999 (TW) ................................................. 88106141

(51) Int. Cl.[7] ........................... H01L 23/48; H01L 23/52; H01L 23/40
(52) U.S. Cl. ........................... 257/737; 257/738; 257/778; 257/783
(58) Field of Search .................................. 257/737, 738, 257/778, 783

(56) References Cited

U.S. PATENT DOCUMENTS 5,468,681 * 11/1995 Pasch .
6,057,598 * 5/2000 Payne et al. .
6,100,594 * 8/2000 Fukui et al. .

* cited by examiner

*Primary Examiner*—David E. Graybill
(74) *Attorney, Agent, or Firm*—Ladas & Parry

(57) ABSTRACT

A semiconductor chip module includes first and second semiconductor chips, and a dielectric tape layer. The first semiconductor chip has a pad mounting surface with a plurality of first bonding pads provided thereon. The dielectric tape layer has opposite first and second adhesive surfaces. The first adhesive surface is adhered onto the pad mounting surface of the first semiconductor chip. The dielectric tape layer is formed with a plurality of holes at positions registered with the first bonding pads to expose the first bonding pads. Each of the holes is confined by a wall that cooperates with a registered one of the first bonding pads to form a contact receiving space. A plurality of conductive contacts are placed in the contact receiving spaces, respectively. The second semiconductor chip has a chip mounting surface adhered onto the second adhesive surface of the dielectric tape layer. The chip mounting surface is provided with second bonding pads that are bonded to the conductive contacts to establish electrical connection with the first bonding pads. A method for manufacturing the semiconductor chip module is also disclosed.

9 Claims, 6 Drawing Sheets

SEMICONDUCTOR CHIP MODULE AND METHOD FOR MANUFACTURING THE SAME

BACKGROUND OF THE INVENTION

1. Field of the Invention

The invention relates to a semiconductor chip module and method for manufacturing the same, more particularly to a semiconductor chip module that has a relatively short signal transmission path between semiconductor chips and that occupies a relatively small amount of board space.

2. Description of the Related Art

With the growing trend toward faster processor chips, the tolerable time delay for signal access to a peripheral memory chip has become increasingly shorter. Therefore, it is imperative for the designer to find a way to shorten the signal transmission path between a processor chip and a peripheral memory chip. On the other hand, with the growing need for a larger memory capacity, the number of memory chips on a printed circuit board is on the rise. However, the area of the printed circuit board is limited. Thus, as to how a large number of memory chips can be incorporated onto a printed circuit board with a minimum impact on board penalty has become a major concern of designers.

SUMMARY OF THE INVENTION

Therefore, the main object of the present invention is to provide a semiconductor chip module and a method for manufacturing a semiconductor chip module, wherein the signal transmission path between semiconductor chips can be shortened to minimize time delay.

Another object of the present invention is to provide a semiconductor chip module and a method for manufacturing a semiconductor chip module, wherein a large number of memory chips can be incorporated onto a printed circuit board without requiring a substantial increase in the size of the latter.

According to one aspect of the present invention, a semiconductor chip module comprises:

a first semiconductor chip having a pad mounting surface with a plurality of first bonding pads provided thereon;

a dielectric tape layer having opposite first and second adhesive surfaces, the first adhesive surface being adhered onto the pad mounting surface of the first semiconductor chip, the dielectric tape layer being formed with a plurality of holes at positions registered with the first bonding pads to expose the first bonding pads, each of the holes being confined by a wall that cooperates with a registered one of the first bonding pads to form a contact receiving space;

a plurality of conductive contacts placed in the contact receiving spaces, respectively; and a second semiconductor chip having a chip mounting surface adhered onto the second adhesive surface of the dielectric tape layer, the chip mounting surface being provided with second bonding pads that are bonded to the conductive contacts to establish electrical connection with the first bonding pads.

According to another aspect of the present invention, a method for manufacturing a semiconductor chip module comprises:

adhering a first adhesive surface of a dielectric tape layer onto a pad mounting surface of a first semiconductor chip, the dielectric tape layer being formed with a plurality of holes at positions registered with first bonding pads provided on the pad mounting surface to expose the first bonding pads, each of the holes being confined by a wall that cooperates with a registered one of the first bonding pads to form a contact receiving space;

placing a plurality of conductive contacts in the contact receiving spaces, respectively; and adhering a chip mounting surface of a second semiconductor chip onto a second adhesive surface of the dielectric tape layer opposite to the first adhesive surface, and bonding second bonding pads provided on the chip mounting surface to the conductive contacts to establish electrical connection with the first bonding pads.

Preferably, the second adhesive surface is provided with a heat-curable adhesive having a curing point that is lower than melting point of the conductive contacts. Thus, adhering of the second semiconductor chip onto the dielectric tape layer and bonding of the second bonding pads to the conductive contacts can be performed simultaneously via a heat curing operation such that the chip mounting surface is already adhered onto the second adhesive surface prior to melting of the conductive contacts.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
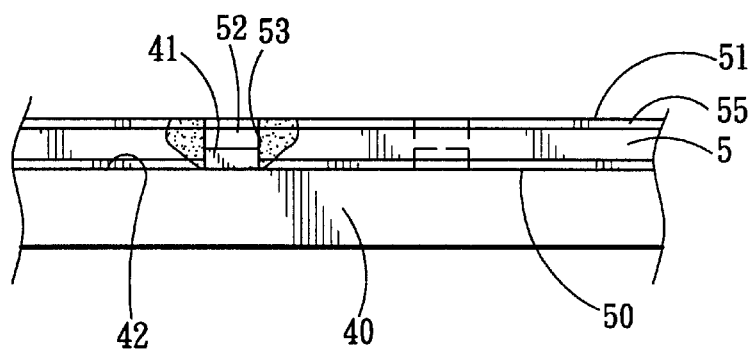
FIGS. 1 to 5 are fragmentary schematic views illustrating the steps of the method for manufacturing the first preferred embodiment of a semiconductor chip module according to the present invention.
Figure 2:
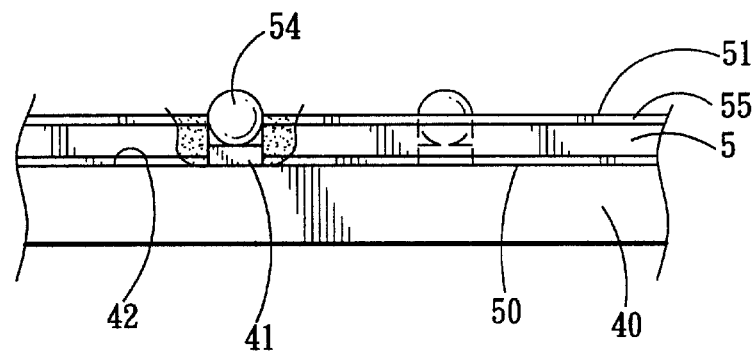
Figure 3:
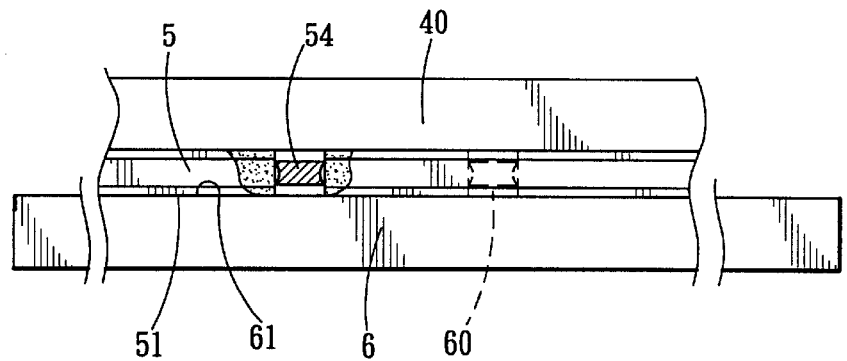
Figure 4:
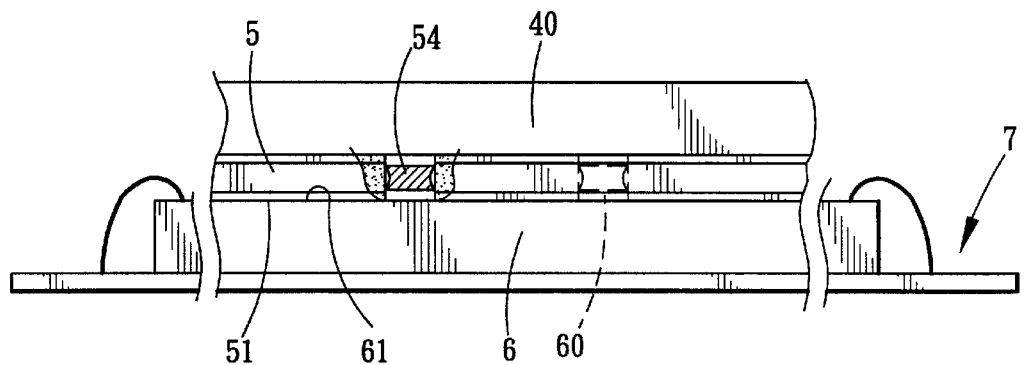
Figure 5:
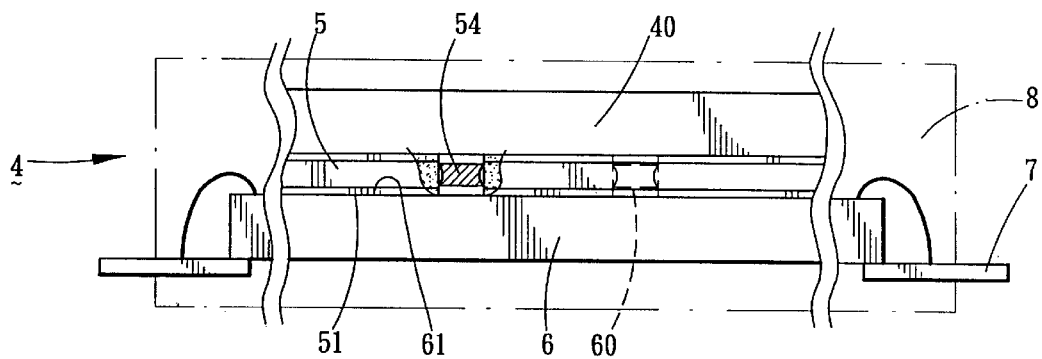

Before the present invention is described in greater detail, it should be noted that like elements are denoted by the same reference numerals throughout the disclosure.

Referring to FIGS. 1 to 5, the first preferred embodiment of a semiconductor chip module 4 according to the present invention is shown to comprise a first semiconductor chip 40, a dielectric tape layer 5 and a second semiconductor chip 6.

The first semiconductor chip 40 has a pad mounting surface 42 with a plurality of first bonding pads 41 provided thereon. In this embodiment, the first semiconductor chip 40 is a memory chip. The dielectric tape layer 5 has opposite first and second adhesive surfaces 50, 51. A heat-curable adhesive 55 is provided on the first adhesive surface 50 such that the first adhesive surface 50 can be adhered onto the pad mounting surface 42 of the first semiconductor chip 40 during a heat curing operation. A conventional laser cutting technique is employed to form a plurality of holes 52 in the dielectric tape layer 5 at positions registered with the first bonding pads 41 to expose the latter.

Each of the holes 52 is confined by a wall 53 that cooperates with a registered one of the first bonding pads 41 to form a contact receiving space. A plurality of conductive contacts 54 are placed in the contact receiving spaces, respectively. In this embodiment, a tin ball is planted in each contact receiving space and serves as a conductive contact 54.

The second semiconductor chip 6 has a chip mounting surface 61 provided with second bonding pads 60 that are to be aligned with and that are to be connected to the conductive contacts 54. In this embodiment, the second semiconductor chip 6 is a processor chip, such as a video data processor, a graphic processor, or an applications specific integrated circuit controller. A heat curing operation is conducted to bond the conductive contacts 54 to the second bonding pads 60, and to adhere the chip mounting surface 61 onto the second adhesive surface 51 of the dielectric tape layer 5. Preferably, the second adhesive surface 51 is provided with a heat-curable adhesive 55 having a curing point that is lower than the melting point of the conductive contacts 54. Thus, the chip mounting surface 61 is already adhered onto the second adhesive surface 51 prior to melting of the conductive contacts 54, thereby sealing the contact receiving spaces so that the melt of each conductive contact 54 is prevented from flowing out of the respective contact receiving space to avoid formation of undesired connections with adjacent conductive contacts 54.

Subsequently, the second semiconductor chip 6 is mounted on a lead frame 7 in a conventional manner. Thereafter, a plastic casing 8 is formed using known packaging techniques to enclose assembly of the first and second semiconductor chips 40, 6 and the lead frame 7, thereby completing the semiconductor chip module 4.

Figure 6:
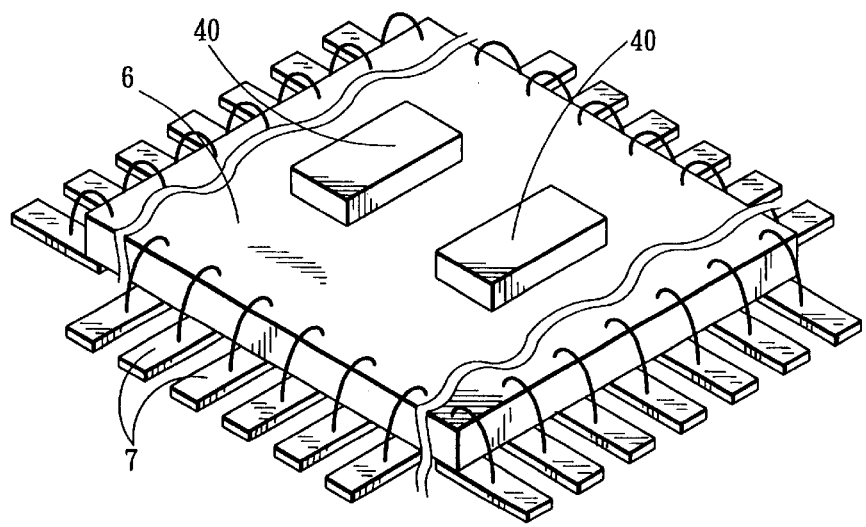
FIG. 6 is a perspective view of the second preferred embodiment of a semiconductor chip module according to the present invention.

Referring to FIG. 6, which shows the second preferred embodiment of a semiconductor chip module according to the present invention, two or more first semiconductor chips 40 can be mounted on the second semiconductor chip 6 in a manner similar to that of the first preferred embodiment.

Figure 7:
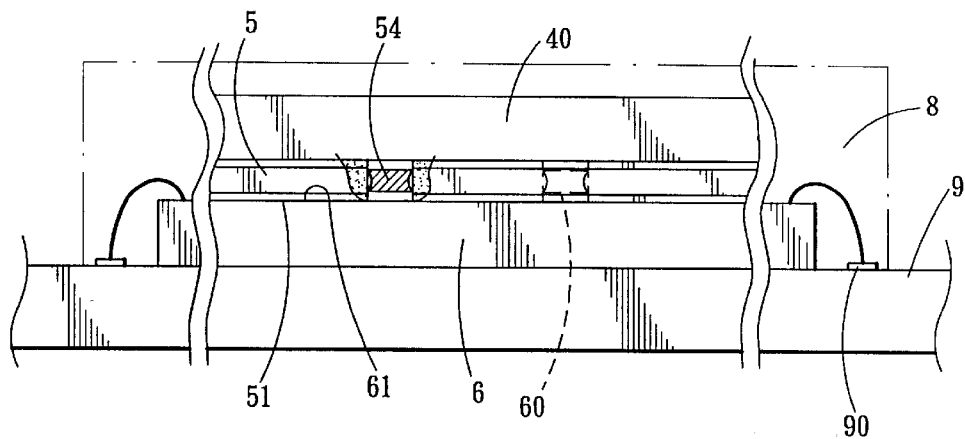
FIG. 7 is a fragmentary schematic view of the third preferred embodiment of a semiconductor chip module according to the present invention.

Referring to FIG. 7, the third preferred embodiment of a semiconductor chip module according to the present invention is shown to be substantially similar to the first preferred embodiment. However, in this embodiment, instead of a lead frame, the second semiconductor chip 6 is mounted on a printed circuit board 9, and the second semiconductor chip 6 is connected electrically to third bonding pads 90 on the printed circuit board 9. Thereafter, a plastic casing 8 is formed using known packaging techniques to enclose assembly of the first and second semiconductor chips 40, 6.

Figure 8:
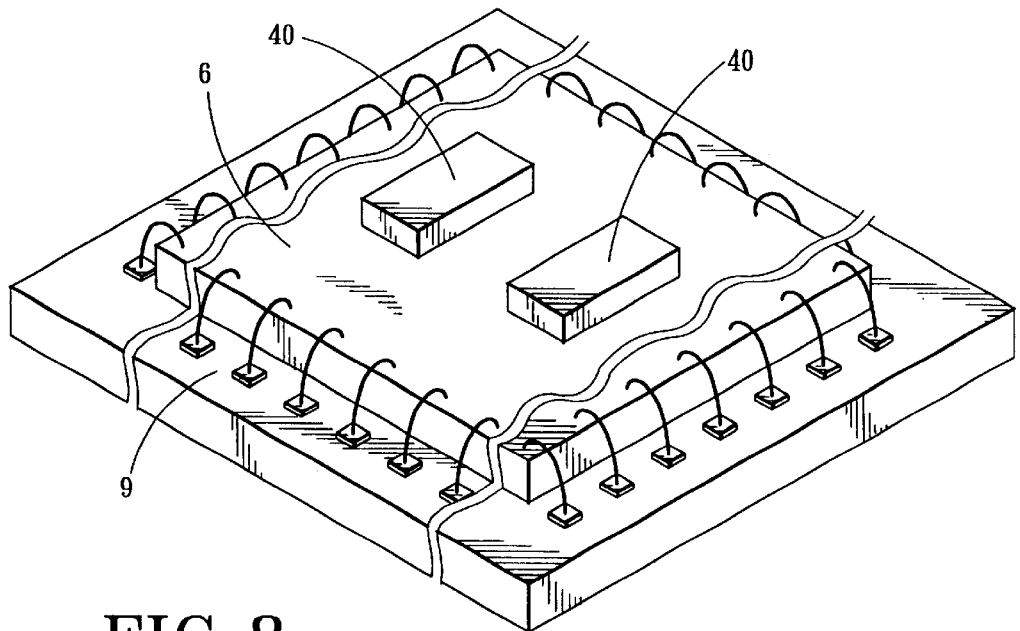
FIG. 8 is a perspective view of the fourth preferred embodiment of a semiconductor chip module according to the present invention.

Referring to FIG. 8, which shows the fourth preferred embodiment of a semiconductor chip module according to the present invention, the third preferred embodiment can be modified such that two or more first semiconductor chips 40 are mounted on the second semiconductor chip 6.

Figure 9:
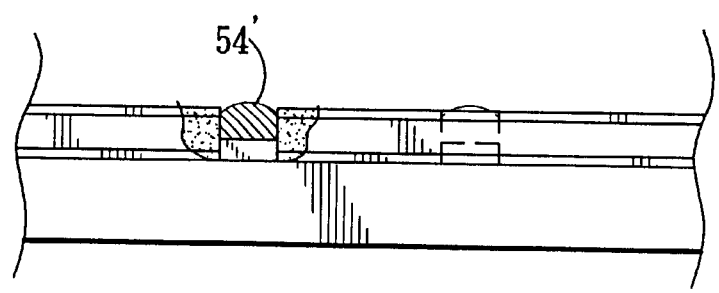
FIG. 9 is a fragmentary schematic view illustrating an intermediate product of the fifth preferred embodiment of a method for manufacturing a semiconductor chip module according to the present invention.

Referring to FIG. 9, in the fifth preferred embodiment of a semiconductor chip module according to the present invention, instead of using tin balls as conductive contacts, each contact 54' is formed from conductive paste, such as conductive silver paste.

Figure 10:
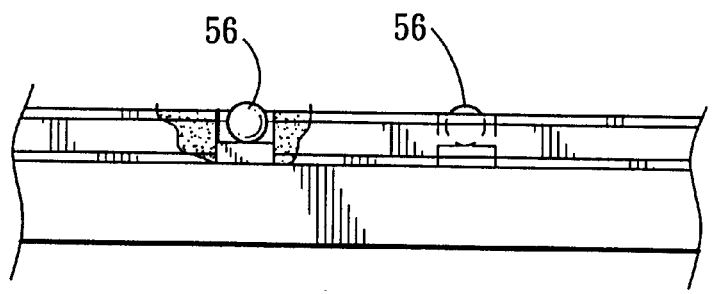
FIGS. 10 and 11 are fragmentary schematic views illustrating some of the steps of the method for manufacturing the sixth preferred embodiment of a semiconductor chip module according to the present invention.
Figure 11:
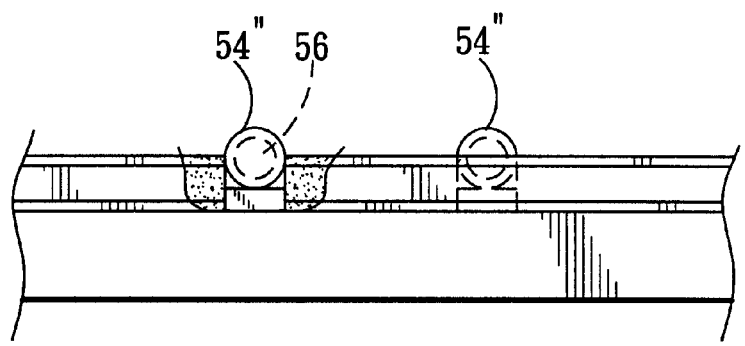

Referring to FIGS. 10 and 11, in the sixth preferred embodiment of a semiconductor chip module according to the present invention, each contact 54" is formed by placing a conductive metal material 56, such as a gold or aluminum ball, in each contact receiving space. A chemical electroplating process is subsequently performed to complete each contact 54" prior to bonding with the second bonding pads on the second semiconductor chip (not shown).

It is noted that the signal transmission path between the first and semiconductor chips 40, 6 is shortened substantially in the semiconductor chip module 4 of this invention. Moreover, since the first semiconductor chip 40 does not occupy an area of a printed circuit board, the area of the printed circuit board can be used more efficiently when the semiconductor chip module 4 is applied thereto. The objects of the present invention are thus met.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A semiconductor device comprising:

a first semiconductor chip having a pad mounting surface with a plurality of first bonding pads provided thereon;

a dielectric layer having opposite first and second adhesive surfaces, said first adhesive surface adhering onto said pad mounting surface of said semiconductor chip, said dielectric layer further having a plurality of holes at positions registered with said first bonding pads to expose said first bonding pads, said holes being confined by respective walls of said dielectric layer that cooperate with said registered first bonding pads to form contact receiving spaces;

a plurality of conductive contacts in said contact receiving spaces, respectively; and a second semiconductor chip having a chip mounting surface adhering onto said second adhesive surface of said dielectric layer, said chip mounting surface being provided with second bonding pads that are bonded to said conductive contacts to establish electrical connection with said first bonding pads, wherein at least one of said first and second adhesive surfaces is provided with a heat-curable adhesive having a curing point for said adhering thereof that is lower than a melting point of said conductive contacts.

2. The semiconductor chip module as claimed in claim 1, further comprising a lead frame having said second semiconductor chip mounted thereon.

3. The semiconductor chip module as claimed in claim 2, further comprising a plastic casing to enclose a assembly of said first and second semiconductor chips and said lead frame.

4. The semiconductor chip module as claimed in claim 1, further comprising a printed circuit board having said second semiconductor chip mounted thereon, said printed circuit board being provided with third bonding pads that are wire-bonded to said second semiconductor chip.

5. The semiconductor chip module as claimed in claim 4, further comprising a plastic casing to enclose a assembly of said first and second semiconductor chips.

6. The semiconductor chip module as claimed in claim 1, wherein said first semiconductor chip is a memory chip, and said second semiconductor chip is a processor chip.

7. The semiconductor chip module as claimed in claim 1, wherein each of said conductive contacts is a tin ball.

8. The semiconductor chip module as claimed in claim 1, wherein each of said conductive contacts is formed from conductive paste.

9. The semiconductor chip module as claimed in claim 1, wherein each of said conductive contacts is formed from a conductive material that undergoes chemical electroplating prior to bonding with said second bonding pads.

* * * * *